United States Patent
Denker et al.

(10) Patent No.: US 6,562,094 B2
(45) Date of Patent: May 13, 2003

(54) RETICLE STORAGE AND RETRIEVAL SYSTEM

(75) Inventors: Jeffrey M. Denker, Woburn, MA (US); John T. Hickey, Nashua, NH (US); Peter J. B. Teague, Marblehead, MA (US); David Jordan, Ashby, MA (US); Jonathan Gordan, Littleton, MA (US); Mitchell Weiss, Carlisle, MA (US)

(73) Assignee: PRI Automation, Inc., Billerica, MA (US)

( * ) Notice: Subject to any disclaimer, the term of this patent is extended or adjusted under 35 U.S.C. 154(b) by 0 days.

(21) Appl. No.: 09/900,526

(22) Filed: Jul. 6, 2001

(65) Prior Publication Data
US 2002/0062633 A1 May 30, 2002

Related U.S. Application Data

(60) Provisional application No. 60/216,194, filed on Jul. 6, 2000.

(51) Int. Cl.[7] .......................... B01D 29/11; B65G 49/07
(52) U.S. Cl. ..................... 55/385.2; 55/410; 55/467; 55/476; 454/187; 414/935
(58) Field of Search ................. 55/385.2, 410, 55/467, 476; 454/187; 414/935, 936, 937, 938, 939, 940

(56) References Cited

U.S. PATENT DOCUMENTS 4,986,715 A * 1/1991 Asakawa ................. 211/163

* cited by examiner

*Primary Examiner*—Robert A. Hopkins
(74) *Attorney, Agent, or Firm*—Weingarten, Schurgin, Gagnebin & Lebovici LLP

(57) ABSTRACT

A storage and retrieval system is provided for safely and efficiently storing reticles in a clean environment. An enclosed storage unit is provided for storing the reticles, and other items such as wafers and the like, in an environment which minimizes the amount of contaminants and is suitable for use in a semiconductor fabrication clean room. A retrieval unit is provided separate from the enclosed storage unit for accessing and staging the reticles before they enter and leave the storage unit for minimizing exposure of the storage unit. The storage unit includes a movable storage matrix having a plurality of bays for storing the reticles. The movable storage matrix is selectively moved or rotated by a drive mechanism that is located external to the storage unit so that the storage unit is substantially free of contaminant generating components.

46 Claims, 15 Drawing Sheets

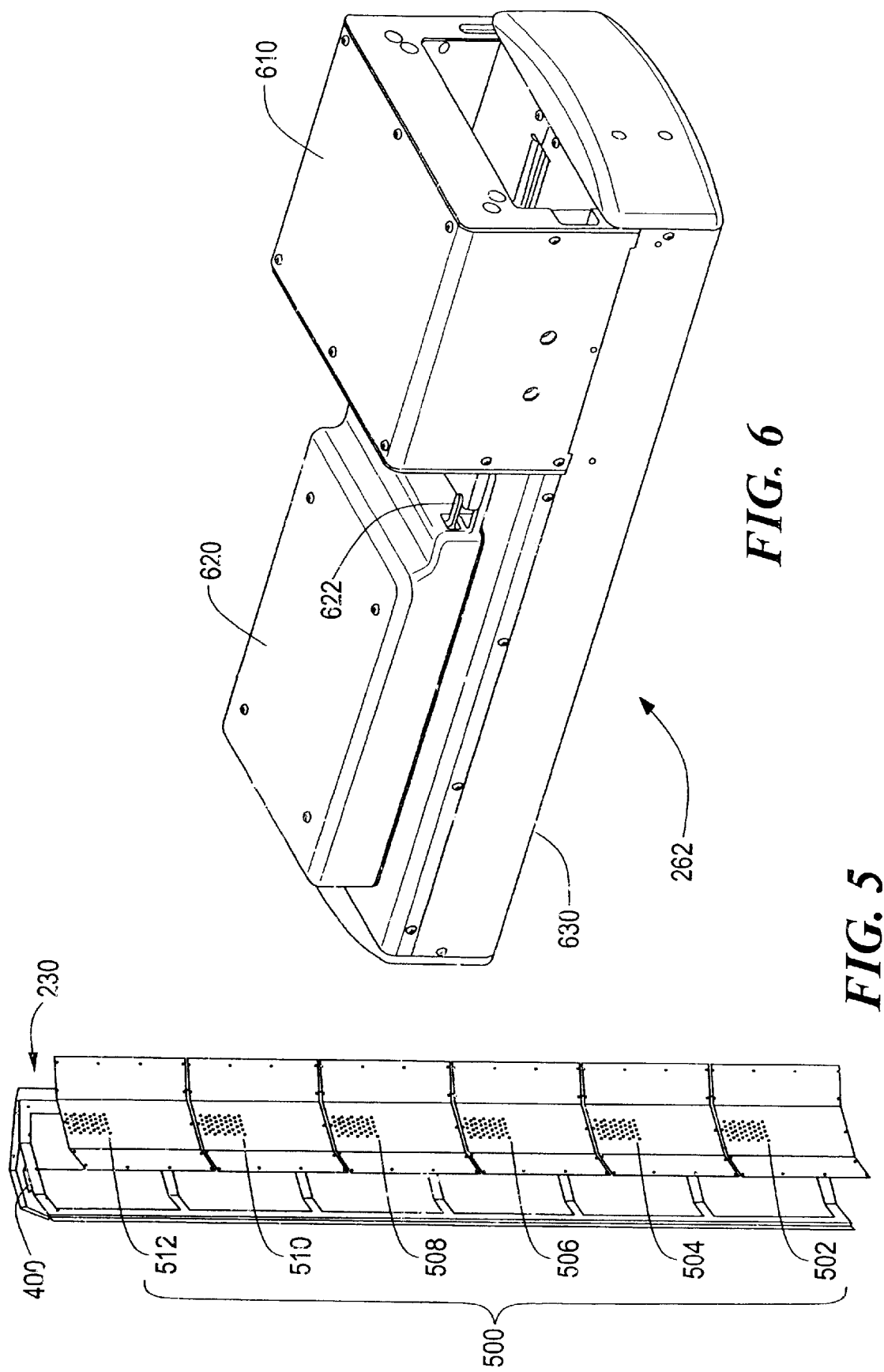

RETICLE STORAGE AND RETRIEVAL SYSTEM

CROSS REFERENCE TO RELATED APPLICATIONS

This application claims priority under 35 U.S.C. §119(e) to provisional patent application Ser. No. 60/216,194 filed Jul. 6, 2000, the disclosure of which is hereby incorporated by reference.

STATEMENT REGARDING FEDERALLY SPONSORED RESEARCH OR DEVELOPMENT

N/A

BACKGROUND OF THE INVENTION

In manufacturing integrated semiconductor circuits, many photolithography processes are performed which require repeated handling of different reticles associated with each of these processes. The reticles contain a mask of the pattern that is to be formed on the semiconductor wafer. Due to the multitude of photolithography processes, semiconductor fabrication clean rooms must store hundreds or thousands of reticles and wafers. As the most valuable component of the fabrication process, reticles are desired to have the highest degree of protection against loss, damage and contamination. If any disruptions occur in the photolithography processes, costly results follow, such as long stepper idle times, reduced productivity and missed product shipment dates. Therefore, a safe and efficient manner of storing and retrieving the reticles is desired.

Present storage and retrieval systems are designed to store and retrieve all of the reticles within a single storage unit. In conventional systems, catastrophic failures to the unit may at least temporarily disable the fabrication operations and potentially destroy the entire inventory of reticles stored therein. These conventional storage units include bays for storing the materials in a two dimensional linear matrix or grid type of arrangement. To store all of the necessary materials for the clean room manufacturing operations, a large storage unit is required. Because the height of the storage unit is limited by the ceiling of the clean room, the length of the unit must be sufficiently long to accommodate the needed storage bays. Therefore, the unit requires a large footprint which places undesirable constraints into the design and layout of the fabrication clean rooms.

A retrieval mechanism is used to retrieve the stored materials from the bays. However, because the retrieval mechanism is required to traverse great distances across the unit, difficulties arise in the repeatability of the mechanism during the retrieval process. In particular, the retrieval mechanism has difficulties in precisely traveling to each bay in the matrix. Travel imprecisions may cause the retrieval mechanism to be misaligned when the desired position in the matrix is reached which may cause damage when attempting to access the materials. As the retrieval mechanism travels to the positions at the outer edges of the grid, these travel imprecisions will be compounded and the likelihood for significant damage to the materials greatly increases. Furthermore, due to the relatively short and wide asymmetrical configuration of the units, difficulties arise in maintaining even airflow throughout these units. Specifically, because the airflow is not uniform, contaminants accumulate at the portions of the grid where the air circulation is insufficient and contaminants may be created by turbulence where the air circulation is too great. As a result, the potential damage to the stored materials increases in these areas of the unit.

A continuous flow of filtered air is desired over the stored materials to prevent particulates from accumulating and contaminating on their surfaces. One goal in the design of clean room equipment is to direct a supply of uniform filtered air over the stored materials. Typically, the flow direction of filtered air in a semiconductor clean room facility is vertical, whereby the filtered air enters through the ceiling, travels vertically downward, and then exits through a perforated floor. Equipment is preferred that utilizes airflow for controlling airborne contamination by exhausting at or near the floor to minimize the release of particles into the room so that the exposure risk of adjacent equipment to possible contamination or particulates from the discharged air is reduced. Most process equipment utilizes the natural vertical flow of air in the room as the primary source of clean filtered air by configuring the equipment with open or perforated tops and a venting system at the bottom for passing the filtered air therethrough.

If more control over the airflow quality is desired within the storage chambers of the equipment, pressurized air is often provided via ductwork and filter elements in the equipment to generate filtered air closer to the materials with "point of use" filters. More specifically, some types of equipment include a subsystem or module including fans (or blowers), and filter elements. Such subsystems, known as Fan Filter Units (FFUs) provide more control of the airflow. The fans generate positive pressure that force air through the filter element material. Many FFUs have adjustments or variable controls for the blower output, which allows control over both the pressure and the velocity of the generated air.

FFUs are typically packaged together into a module such that the blower is placed directly behind a planar filter element and enclosed in a housing that will allow the output of the fan to exhaust only through the filter element. The FFUs are then placed into the equipment either as a top mounted unit for directing airflow downward, or a side mounted for generating horizontal airflow. The ability of the blower to uniformly generate air over a large surface area filter often causes irregularities in the airflow rate exiting the filter. In systems requiring large areas of filter coverage, multiple FFUs are typically assembled into an array for generating sufficient uniformity of the discharged air.

Another goal in clean room design is to ensure that uniform airflow travels through the system after leaving the surface of the filter elements. Areas in storage chambers having non-uniform, turbulent, or little or no airflow may result from chambers with asymmetric volumes, changes to the airflow direction, multiple airflow directions, and uncontrolled venting. Some known systems incorporate FFUs and regulate the exhaust rate so that a positive internal pressure with respect to the surrounding environment is developed and maintained. As a result, contamination migration into the chamber may be reduced.

However, these systems fail to generate uniform flow of filtered air that is required within a high aspect ratio volume of storage chambers in storage and retrieval systems. Within such storage chambers, a vertical flow direction does not prevent particle accumulation on the bottom surface of the reticles or substrates stored horizontally in a shelf of the chamber. Also, airflow traveling over the edges of the reticles often causes turbulence which may lead to contamination and damage to the reticles.

Furthermore, any particulate contamination that is present on the reticles in the upper chamber may become dislodged.

Accordingly, a higher concentration of particulates results in the air traveling downward through the system, and the exposure of the reticles or substrates stored in the lower storage locations are subjected to a much higher risk of contamination. Multiple units of rectangular/planar FFUs mounted along the sides of the chamber may generate an inward horizontal flow of air. However, because of the proximity of the FFUs to the movable storage locations, the air tends to coalesce at the center of the chamber after flowing past the storage locations because no efficient means exists for exhausting the air exits without generating turbulence. Such a storage chamber also would require an access point to facilitate the loading and unloading of stored reticles. At such an access point, it would not be possible to place a filter element and therefore a disruption to the uniformity of airflow would result in this area.

It is therefore desirable to have a storage and retrieval system for reticles, wafers and similar items that safely and precisely stores and retrieves the items in a clean room environment. A system is also desired which minimizes contamination by uniformly and optimally controlling the flow of air therethrough.

BRIEF SUMMARY OF THE INVENTION

The present invention is directed to a storage and retrieval system for safely and efficiently storing reticles in a clean environment. An enclosed storage unit is provided for storing the reticles, and other items such as wafers and the like requiring a clean environment, which minimizes the amount of contaminants and is suitable for use in a semiconductor fabrication clean room. A retrieval unit is also provided separate from the enclosed storage unit for accessing and staging the reticles before they enter and leave the storage unit so that exposure of the storage unit is minimized. The retrieval unit includes a reticle transfer unit for passing the reticles through an access port between the storage and retrieval units.

The storage unit includes a movable storage matrix having a plurality of bays for storing the reticles. Preferably, the movable storage matrix is cylindrical with the bays located about the circumference thereof. The movable storage matrix is selectively moved or rotated by a drive mechanism that is located outside of the enclosed storage unit. The drive mechanism moves or rotates the movable storage matrix so that the access port is aligned with a desired bay or column of bays. After the drive mechanism aligns the movable storage matrix and the access port, the reticle transfer unit then retrieves the desired reticles from the corresponding bay. By rotating the movable storage matrix for accessing the reticles, the distance required by the reticle transfer unit to move is greatly reduced. Thereby, the reticles can be more precisely retrieved and stored with greater repeatability so that handling damage and contamination are minimized.

The system is designed so that the storage unit is essentially enclosed except during the storage and retrieval operations during which the storage unit is only minimally exposed. The storage unit is also designed to be substantially free of motors, moving parts, circuitry, and other contaminant generating components. For instance, features associated with the operation of the storage unit are located external to the storage unit, such as the drive mechanism for moving the movable storage matrix. By removing such components from the storage unit, these sources of contamination are reduced or even eliminated.

The compactness and symmetrical design of the system allows air to circulate uniformly throughout the storage unit. The air is vented from the storage unit to increase the uniformity of the airflow throughout the unit. By uniformly circulating and venting filtered air throughout the storage unit, the amount of potential contaminants exposed to the reticles are minimized throughout the system. The compact design also allows the system to utilize a small footprint so that greater flexibility is achieved in the placement of the system within the manufacturing room.

Other aspects, features and advantages of the present invention are disclosed in the detailed description that follows.

BRIEF DESCRIPTION OF THE SEVERAL VIEWS OF THE DRAWING

The invention will be more fully understood by reference to the following detailed description of the invention in conjunction with the drawings, of which:

FIG. 5 is a cut-away view of the side supports which illustrates air return panels for a storage and retrieval system according to an embodiment of the present invention;

FIG. 6 is a detailed illustration for portions of the reticle transfer unit according to an embodiment of the present invention;

DETAILED DESCRIPTION OF THE INVENTION

Figure 1A:
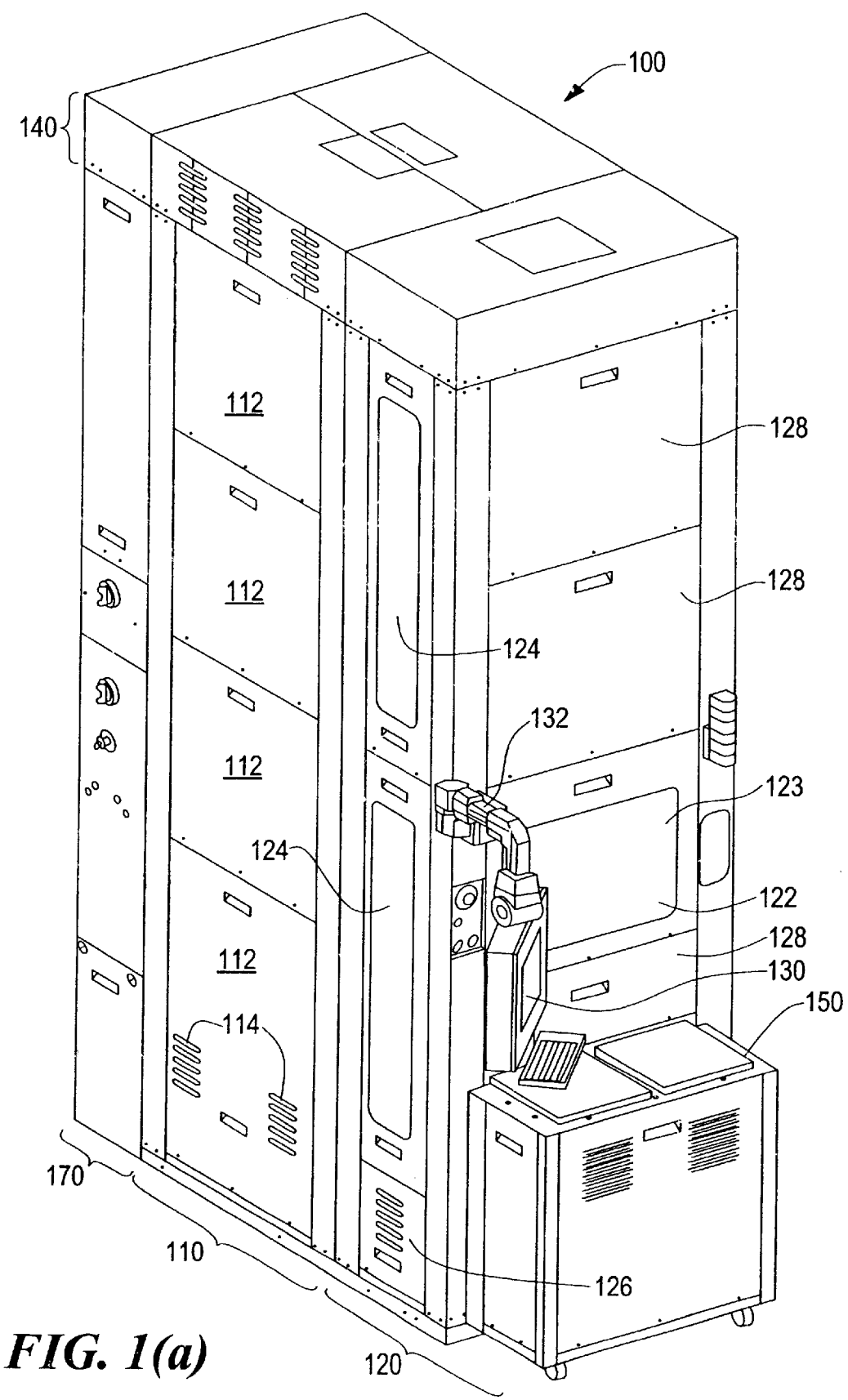
FIGS. 1(*a*) and 1(*b*) illustrate a storage and retrieval system according to an embodiment of the present invention.
Figure 1B:
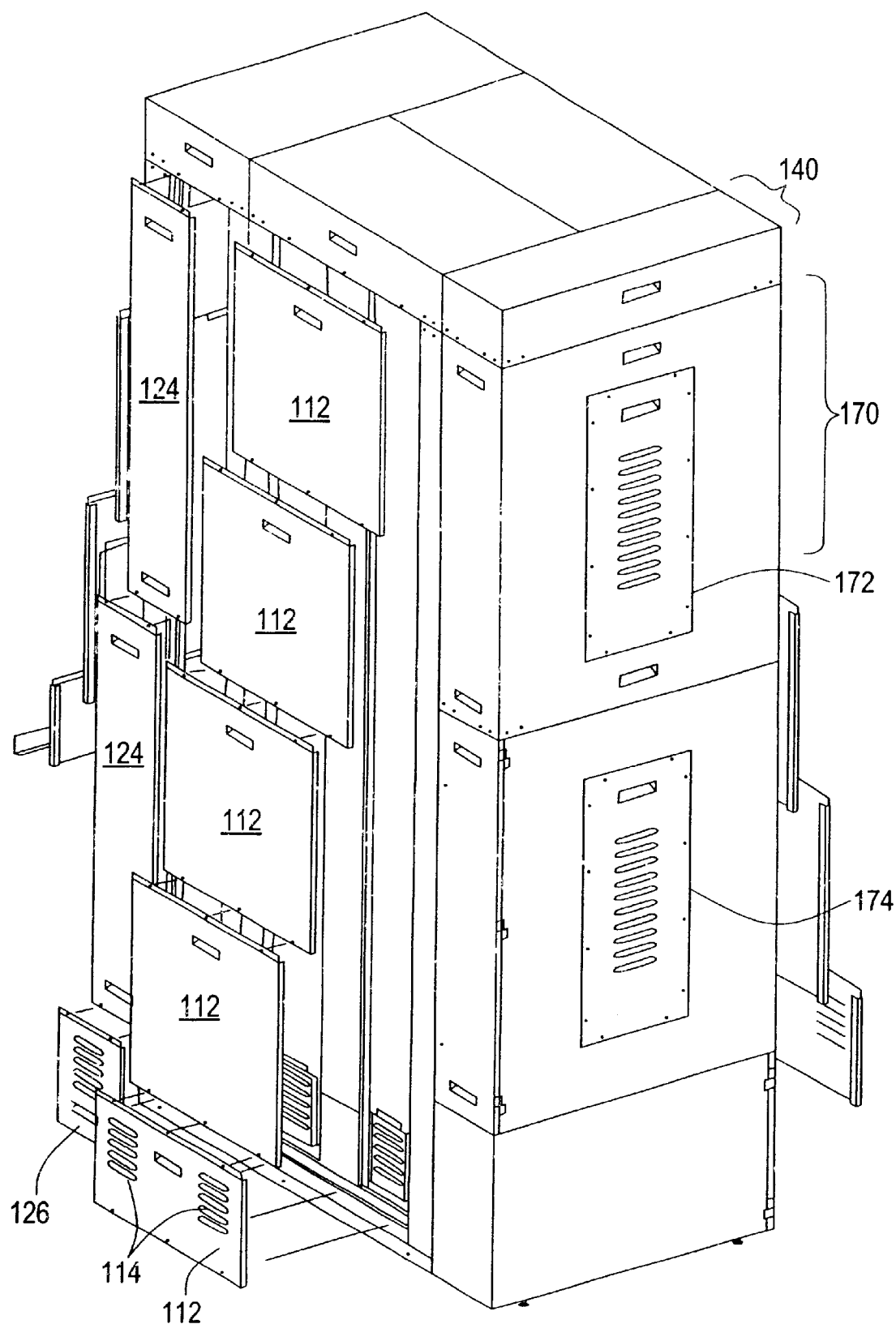

FIGS. 1(*a*) and 1(*b*) illustrate exemplary views of a storage and retrieval system 100 for reticles according to an embodiment of the present invention. It should be appreciated that the present storage and retrieval system 100 is also suitable for wafers and other items requiring a clean environment. The system 100 includes an enclosed storage unit 110 for storing reticles, a retrieval unit 120 for accessing the reticles, a controller 130 for controlling the operation of the system 100, an air supply 140 for supplying filtered air to the storage unit 110, and a staging area 150 for staging the reticles when entering or leaving the storage unit 110. The storage unit 110, which will be described in more detail in the figures that follow, stores the reticles in an environment which minimizes the amount contaminants by substantially separating the storage unit 110 from the rest of the system. Specifically, motors, moving parts, circuitry and the like are designed to be positioned outside of the storage unit 110 so that they are substantially eliminated from its interior. The storage unit 110 includes access panels 112 for initial loading and later servicing of its interior and at least one access panel 112 having vents 114 for venting air from the storage unit 110. The circuitry portion 170 at the rear of the system 100 is illustrated in FIG. 1(*b*). Rear electrical access panels 172 and 174 are provided in the circuitry portion 170.

The retrieval unit 120, which is separate from the storage unit 1101 is used to place and retrieve the reticles to and from the storage unit 110. A reticle transfer unit and an access port (which will be shown in following figures) are included within the retrieval unit 120 for accomplishing the storage and retrieval of the reticles. The retrieval unit 120 includes a door 122 having a viewing window 123 which may be opened to access the reticles within the interior thereof. The retrieval unit 120 is enclosed so that contaminants are minimized to the extent possible in view of the accessing that is required. Moving parts, motors, and circuitry are included within the retrieving unit 120 but isolated so that contaminants are prevented from being unnecessarily introduced. The retrieval unit 120 also includes side viewing windows 124 and at least one venting panel 126.

A movable arm 132 preferably attaches the controller 130 to the retrieval unit 120 so that storage and retrieval of the reticles can be viewed while operating the controller 130. The movable arm 132 allows the controller 130 to be optimally positioned. Preferably, a computer having a sufficient microprocessor and memory for operating the control software is used as the controller. The staging area 150 is positioned proximate to the door 122 for placing the reticles on the top surface thereof.

The air supply 140 may be attached either to the top or side of the system 100. The air supply 140 supplies filtered air to the storage unit 110 and will be described in more detail with reference to the following figures. In the present embodiment, the air supply 140 is attached to the top of the storage unit 110. However, in other embodiments, the air supply 140 may be attached to the side of the storage unit 110 when the system 100 is constrained by the ceiling height in the room.

Figure 2:
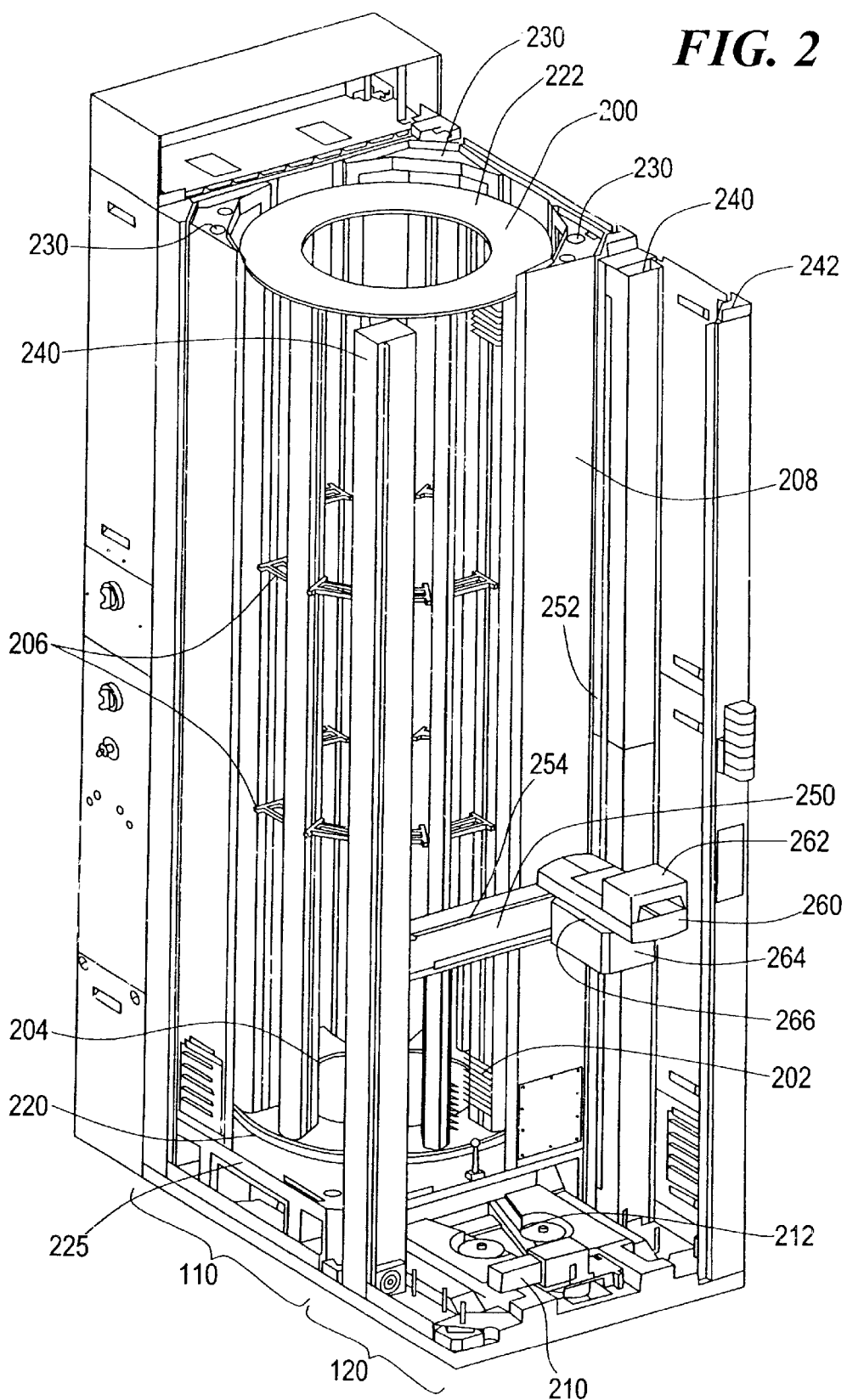
FIG. 2 illustrates a sectional view of the interior of a storage and retrieval system according to an embodiment of the present invention.
Figure 3:
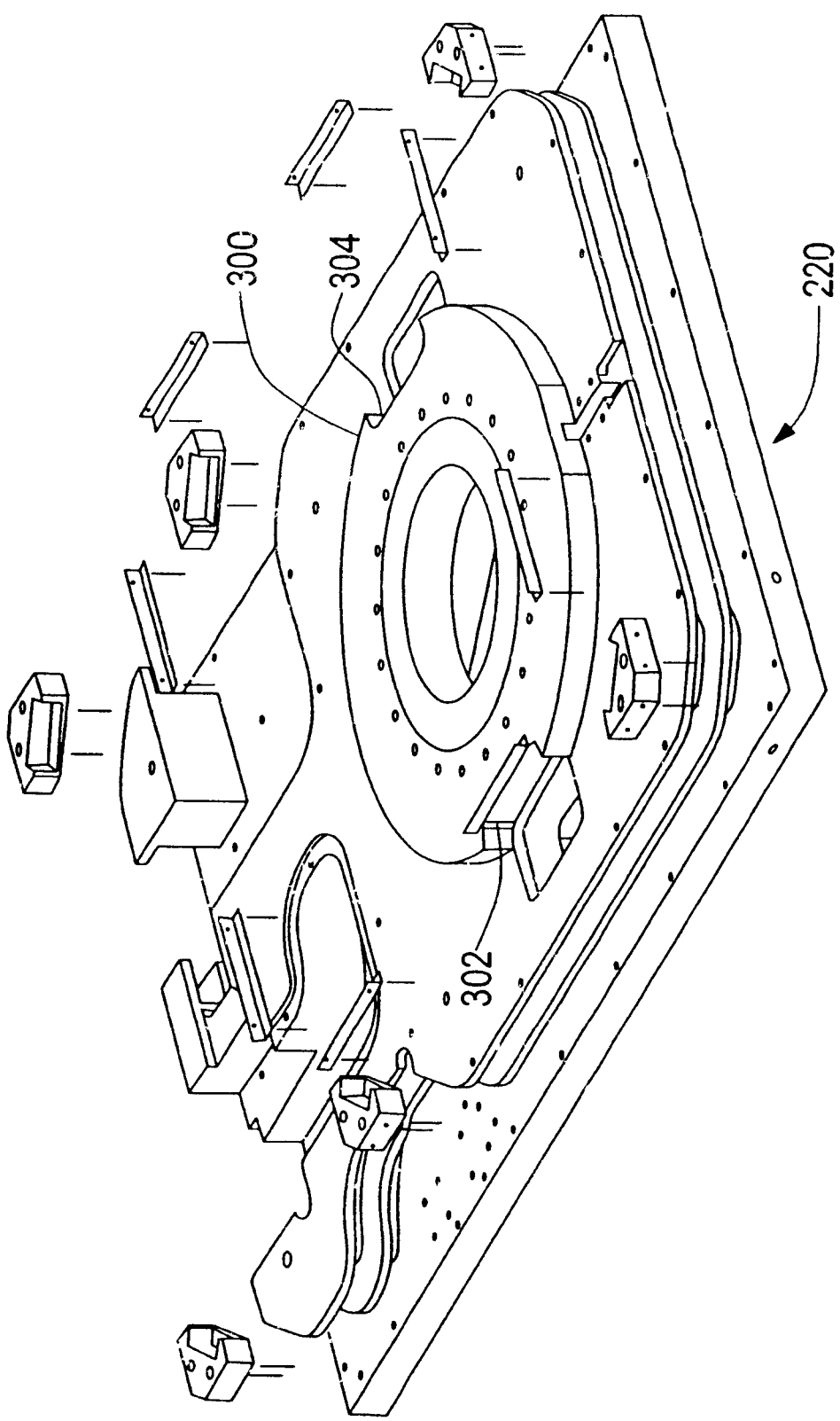
FIG. 3 illustrates a view of a support and driving mechanism for a storage and retrieval system according to an embodiment of the present invention.
Figure 4:
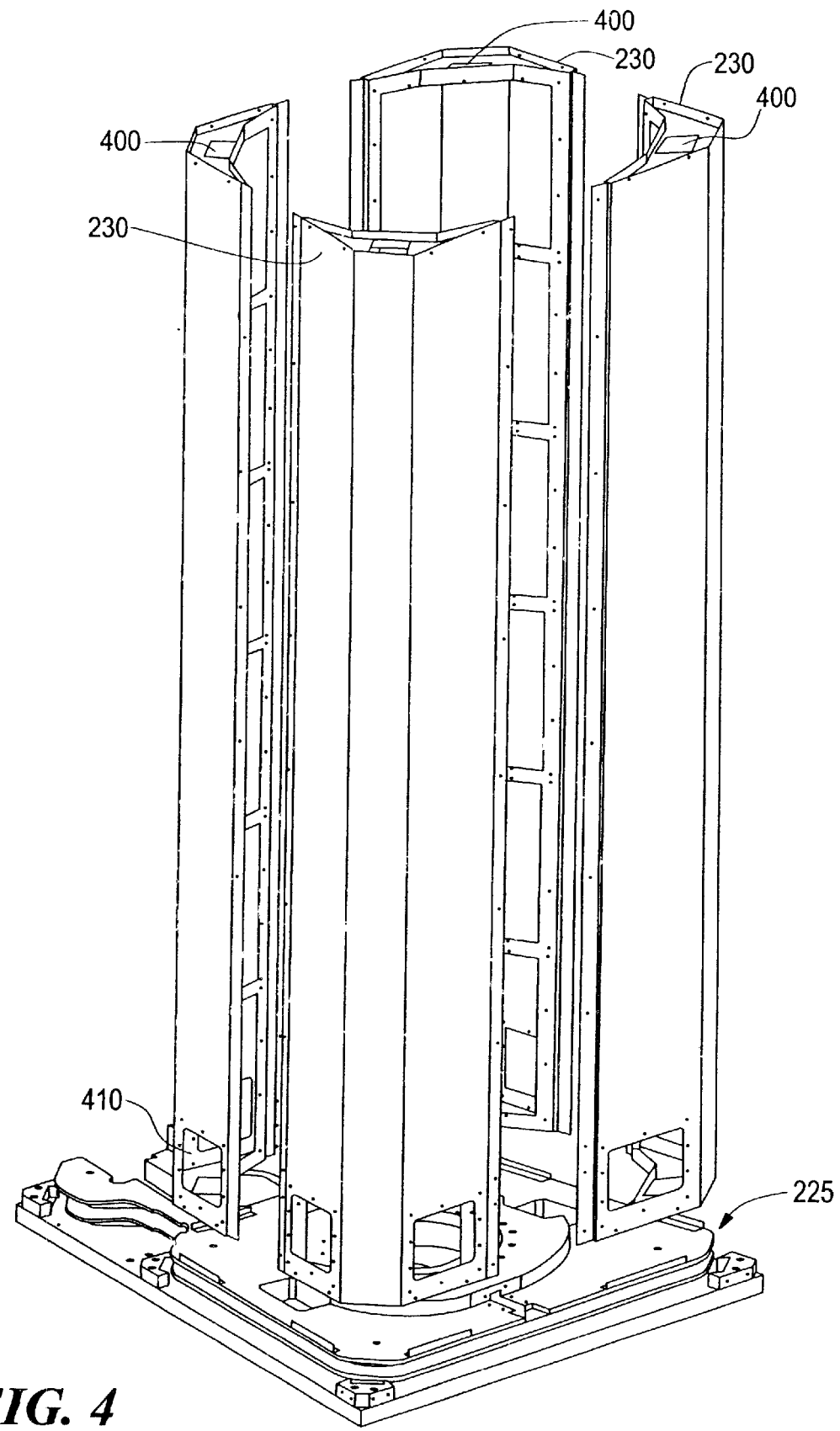
FIG. 4 illustrates side supports for a storage and retrieval system according to an embodiment of the present invention.

A cut-away view for one embodiment of the system is shown in FIG. 2. A more detailed description for the interior of the system will be provided with FIGS. 2–5. The interior of the storage unit 110 is shown to include a movable storage matrix 200, top and bottom matrix supports 220 and 222, and storage frame supports 230. In the present embodiment, the movable storage matrix 200 is a cylindrical carousel including a plurality of bays 202 positioned between bay supports 204. The bays 202 are designed to be of the appropriate dimensions for holding the desired reticles. Although the present embodiment illustrates the movable storage matrix 200 being configured as a cylindrical carousel, it is appreciated that the movable storage matrix 200 may be designed to be of any shape and configuration, such as triangular, rectangular or octangular shapes as just a few examples, so long as the movable storage matrix 200 is rotatable or movable within the storage unit 110. The movable storage matrix 200 includes top and bottom matrix supports 220 and 222 for aligning the bays 202 and bay supports 204. Additional spacers 206 may be placed between the bay supports 204 as necessary to maintain alignment based upon the height of the movable storage matrix 200.

The bottom matrix support 220 is engaged with an engagement gear 300. In the present embodiment, the movable gear 300 is a slightly smaller circle than the circular opening of the bottom matrix support 220 so that the gear 300 and the bottom matrix support 220 fit tightly together. To ensure that the gear 300 and the bottom matrix support 220 move together without slipping, notches 302 and 304 may be formed in the gear 300 to engage with tabs (not shown) of the bottom matrix support 220. It is appreciated that the gear 300 and the opening in the bottom matrix support 220 may be in different shapes other than circular.

The gear 300 is placed on a sub-floor 225 of the storage unit 110. The reticles stored in the bays 202 of the movable storage matrix 200 above the sub-floor 225 are separated from the movable parts, motors and circuitry below the sub-floor 225. The gear 300 extends down underneath the sub-floor 225 and connects to a storage matrix drive motor 210 by a belt 212. The drive motor 210 is placed away from the storage unit 110 and beneath the retrieval unit 210 in the present embodiment to reduce the possibility of contaminants being introduced into the storage unit 110.

The storage frame supports 230 are attached to the corners of the sub-floor 225 so that panels 112 and other surfaces or covers can be placed therebetween to enclose the storage unit 110. The surface of the storage unit 110 adjacent to the retrieval unit 120 includes a pair of panels that cover both sides of the surface while leaving a center column open as the access port. Each of the storage frame supports 230 includes an air return passageway 400 extending the entire length thereof. Each of the storage frame supports 230 also includes an air vent 410 slightly above the sub-floor 225. The storage frame supports 230 include variable air return panels 500 that allow the air to escape from the interior of the storage unit 110 to the air return passageway 400. The variable air return panels 500 are designed to allow varying amounts of air to escape so that a uniform air flow is achieved throughout the storage unit 110.

Generally, the air return panels 500 that allow less air to escape are positioned near the bottom of the storage unit 110 while ones of the air return panels 500 that allow more air to escape are positioned near the top of the storage unit 110. In the present embodiment of FIG. 5, the air return ducts are configured with a plurality of perforated air return panels 502, 504, 506, 508, 510, and 512 in varying percentages of return area openings ranging from a 5% return area opening at the bottom air return panel 502 to a 50% return area opening at the top most air return panel 512. The purpose of the air return panels 502, 504, 506, 508, 510, and 512 is to regulate the flow rate into the air return passageway 400 and to compensate for frictional loss and hydrostatic pressure differences that would otherwise effect the uniformity of the airflow rate entering each of the air return panels as a function of the elevations within the storage unit 110. The net result is to establish a uniformly horizontal flow pattern within the entire elevation of the storage unit 110.

Because the percent open area of perforations required is dependent on the specific geometry of the storage unit 110, the cross section of the air return passageway 400, and the total volume flow rate, other percent open area values, the quantity of the air panels, and the rate of change of perforations can therefore be envisioned. For instance, in one exemplary embodiment, the variable air return panels are configured to include the air return panel 502 having a 5% air return opening, the air return panel 504 having a 10% air return opening, the air return panel 506 having a 20% air return opening, the air return panel 508 having a 30% air return opening, the air return panel 510 having a 40% air return opening, and the air return panel 512 having a 50% air return opening. It is appreciated that the return area openings are not proportional to the amount of air entering the respective air return panels. The purpose is to establish and maintain a uniform amount (volume flow rate CFM) entering the duct from top to bottom. Without the aid of the restricted perforation rate, the frictional losses associated with pipe flow and the varying flow velocity of the air within the air return passageway 400 (the velocity increases towards the base), the air would tend to follow the path of least resistance. In this case, a large proportion of the air would enter the bottom most air return panel, which is closest to the external exhaust port of the duct, and therefore prevent uniform horizontal flow rate from the air supply 140 to the air return passageway 400 as a function of elevation. The air return panels configuration according to the embodiments of the present invention is directed to maintaining a uniform horizontal flow pattern within the storage unit 110.

A cut-away view of the retrieval unit 120 is also illustrated in FIG. 2. The retrieval unit 120 includes two frame supports 240 at the surface adjacent to the storage unit 110 and two frame supports 242 at the opposite front surface of the retrieval unit 120. Panels, doors, vents and windows 122, 123, 124, 126 and 128 are placed between these supports 240 and 242 to enclose the retrieval unit 120. A moveable reticle transfer support 250 is positioned within guides 252 of frame supports 240 so that the reticle transfer support 250 may move vertically along the length of the frame supports 240 in response to the controller 130.

A reticle transfer unit 260 is connected within the retrieval unit 120 in a manner which allows horizontal, vertical, backward and forward movements in response to commands from the controller 130. The reticle transfer unit 260 includes a reticle garage 262 attached to a support housing 264. The reticle garage 262 is used to deliver and retrieve the reticles to and from the movable storage matrix 200 by being slidably engaged in a track 266 of the support housing 264 to move towards and away from the storage unit 110. The support housing 264 is slidably engaged in a track 254 of the module support 250 which allows horizontal movement of the reticle transfer unit 260. As a result, the reticle transfer unit 260 is able to precisely move to any coordinate along the front surface of the storage unit 110 so that desired reticles can be accessed from the appropriate bays 202.

Figure 7:
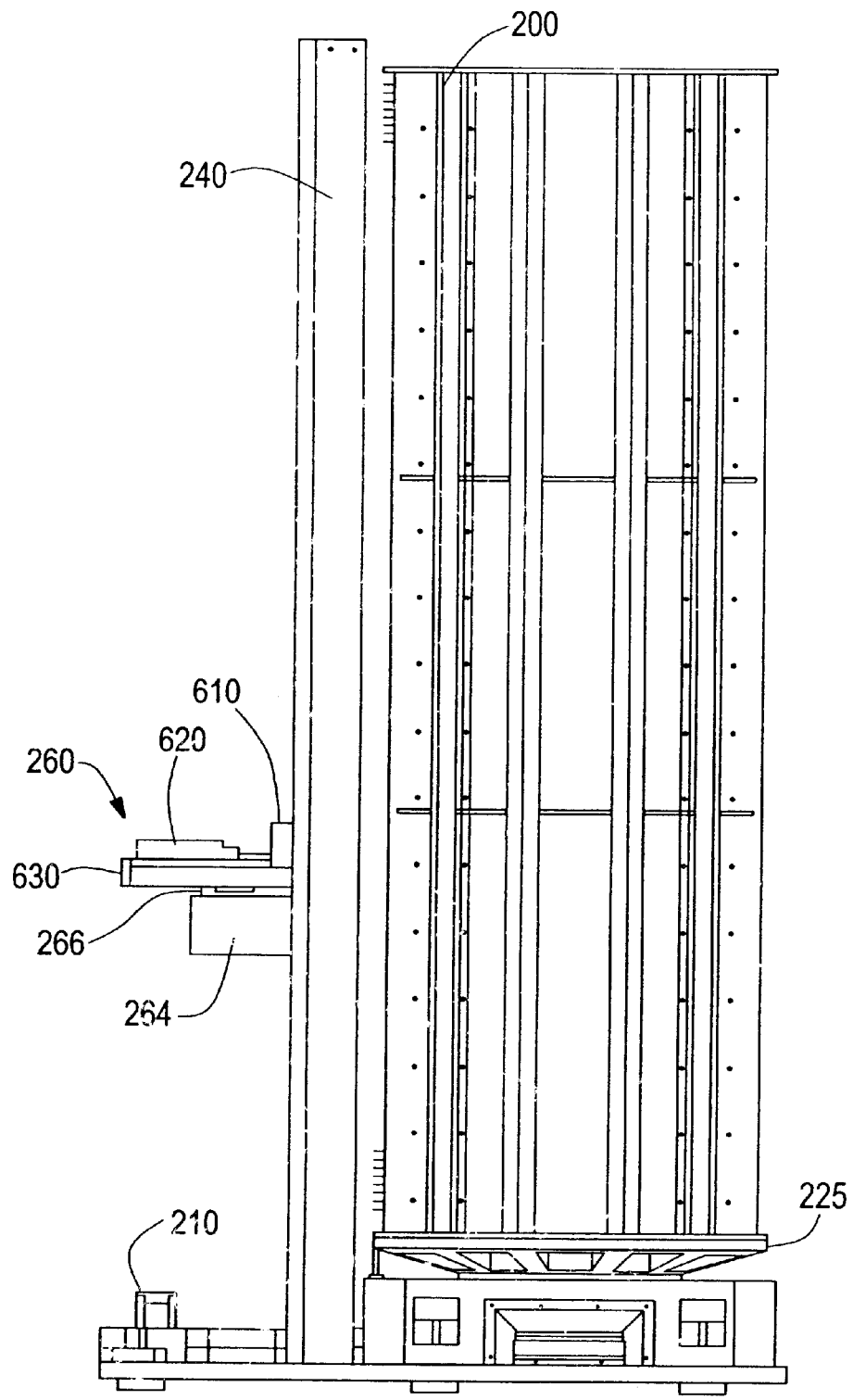
FIG. 7 is a side view illustrating the storage and retrieval mechanism and the reticle garage according to an embodiment of the present invention.
Figure 8:
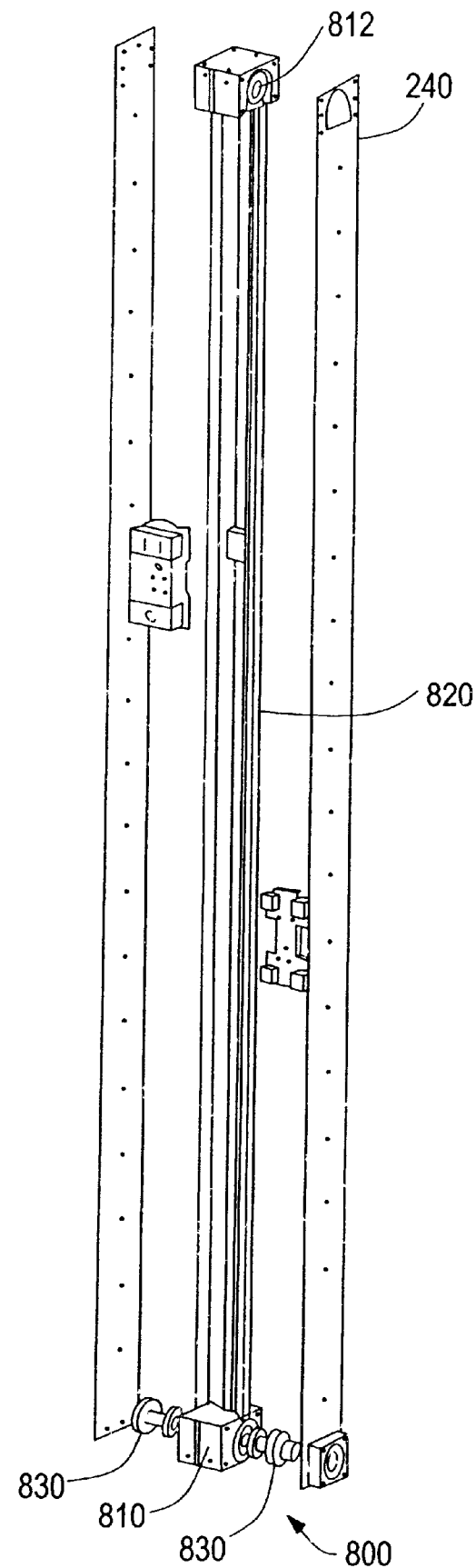
FIG. 8 illustrates the pulley system for the reticle transfer unit according to an embodiment of the present invention.

FIGS. 6–8 illustrate the reticle transfer unit 260 and its relation to the system in more detail. A covered entry port 610, a transfer block 620, and a body 630 are included as part of the reticle garage 262. In storing or retrieving the reticles, an operator places or recovers the desired reticle from the body 630. When storing, the desired reticle is placed on the body 630, then the reticle contacts the transfer block 620 and slides along the body 630 through the entry port 610 and then grippers 622 extending from the transfer block 620 are used to place the reticle into the desired bay 202 of the movable storage matrix 200. When retrieving, the grippers 622 of the transfer block 620 access the reticle from the desired bay 202 and through the entry port 610 onto the body 630, and then the reticle slides along the transfer body 630 by contact from the transfer block 620 for recovery by an operator. A tracking mechanism 800 is used to move the reticle transfer unit 260 along the frame supports 240. The tracking mechanism 800 includes lower and upper housings 810 and 812 for a pulley 820 and wheels 820 for guiding the lower housing 810 along the frame supports 240.

Figure 9:
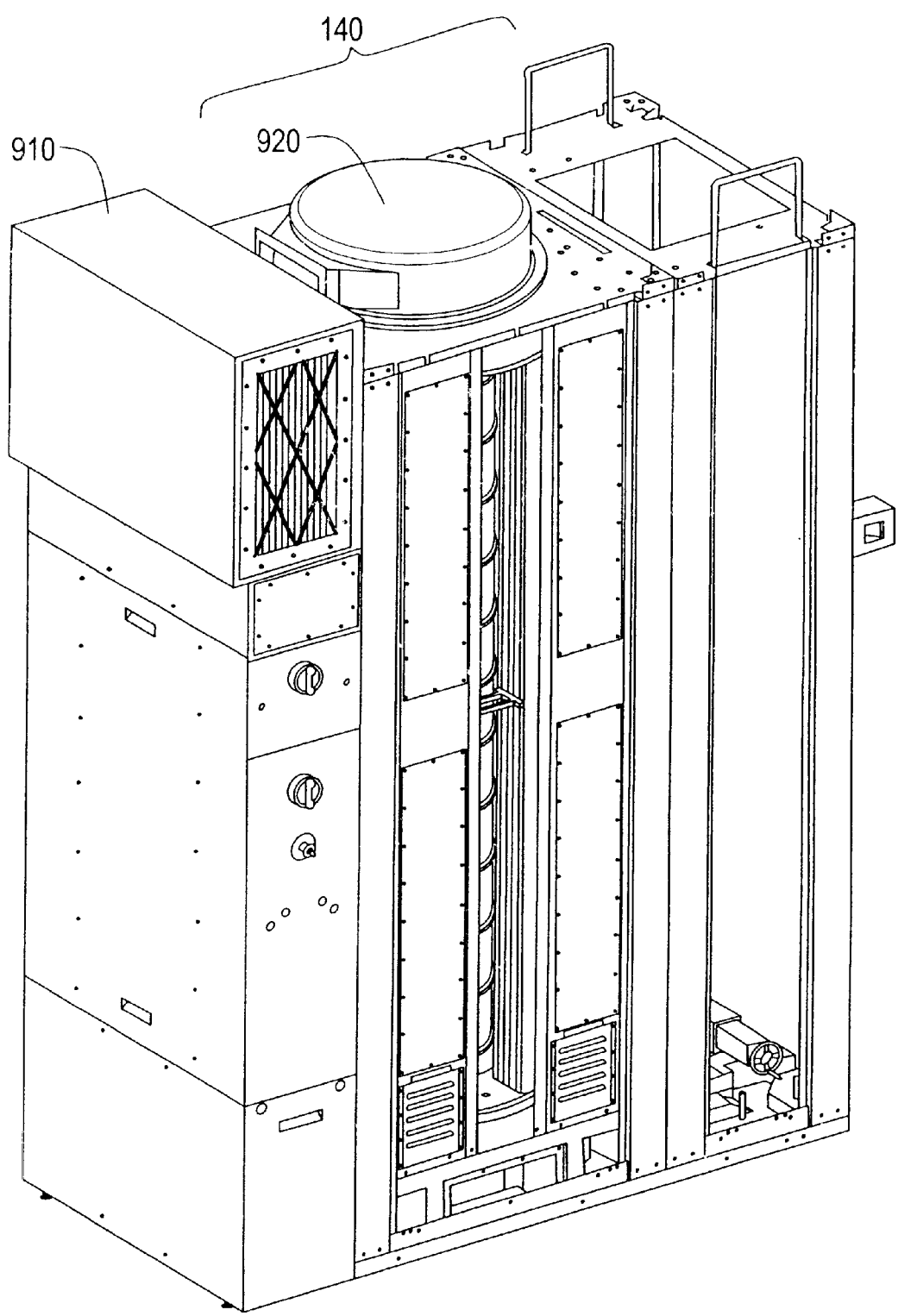
FIG. 9 illustrates an air filter system for a storage and retrieval mechanism according to an embodiment of the present invention.
Figure 10:
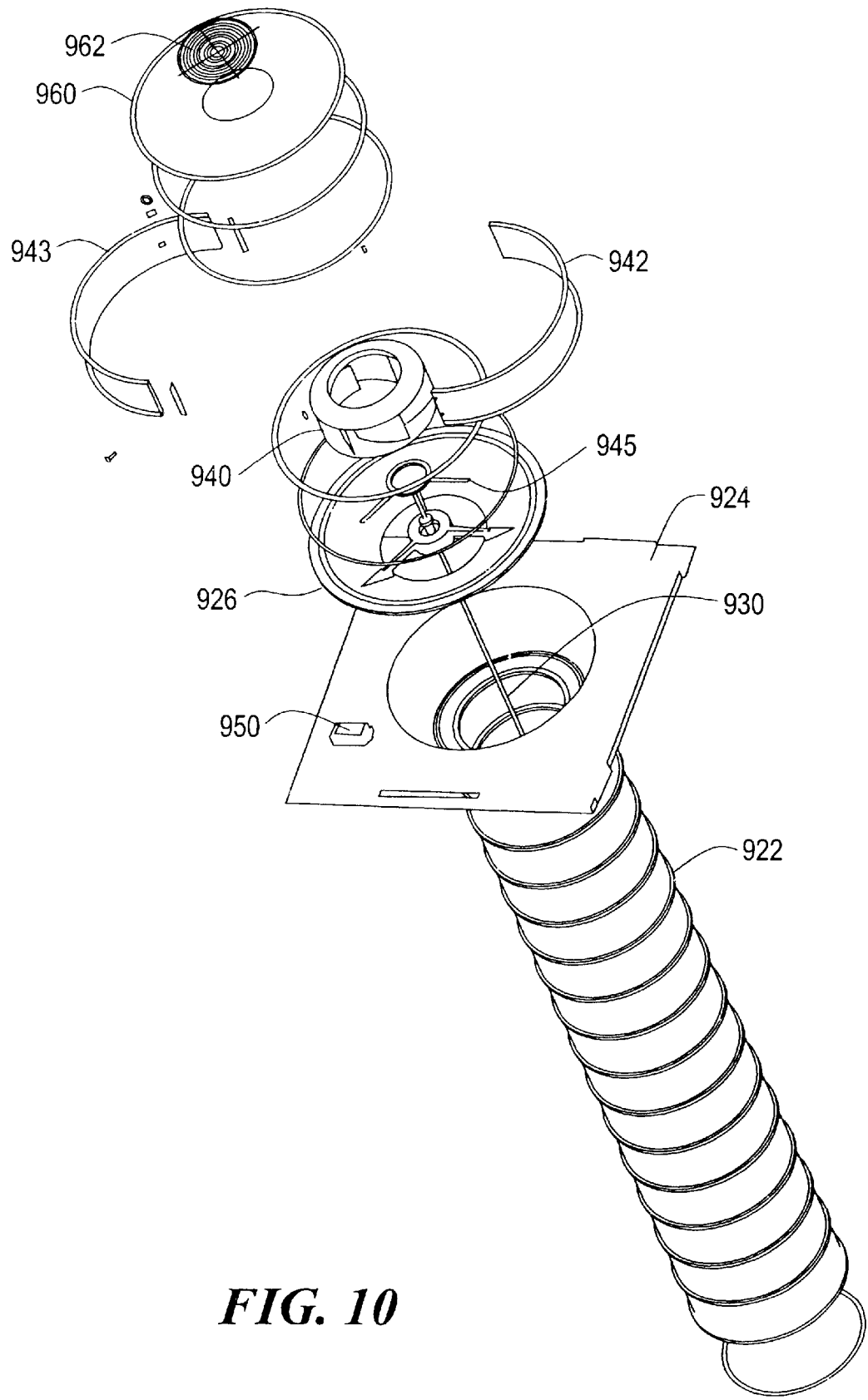
FIG. 10 is an exploded view which illustrates components of the air filter system according to an embodiment of the present invention.

FIGS. 9 and 10 illustrate an embodiment of the air supply 140. In this embodiment, the air supply 140 includes a side mounted filter motor 910 and the air filter unit 920. The air filter unit 920 is placed directly above the movable storage matrix 200 on top of the storage unit 110 and is connected to the filter motor 910. The filter unit 920 includes a filter 922 that extends through the center of the movable storage matrix 200, a vault roof 924, and a filter mount 926 for connecting the filter unit 920 to the storage unit 110. A tensioning rod 930 extends through the center of the filter 922 and is connected to an impeller 940. The impeller 940 includes impeller housings 942 and 943 and an impeller mount 945. A pressure sensor 950 for sensing the pressure within the storage unit 110 is located on the vault roof 924. A top 960 and a finger guard 962 cover the top of the air filter unit 920.

Figure 11:
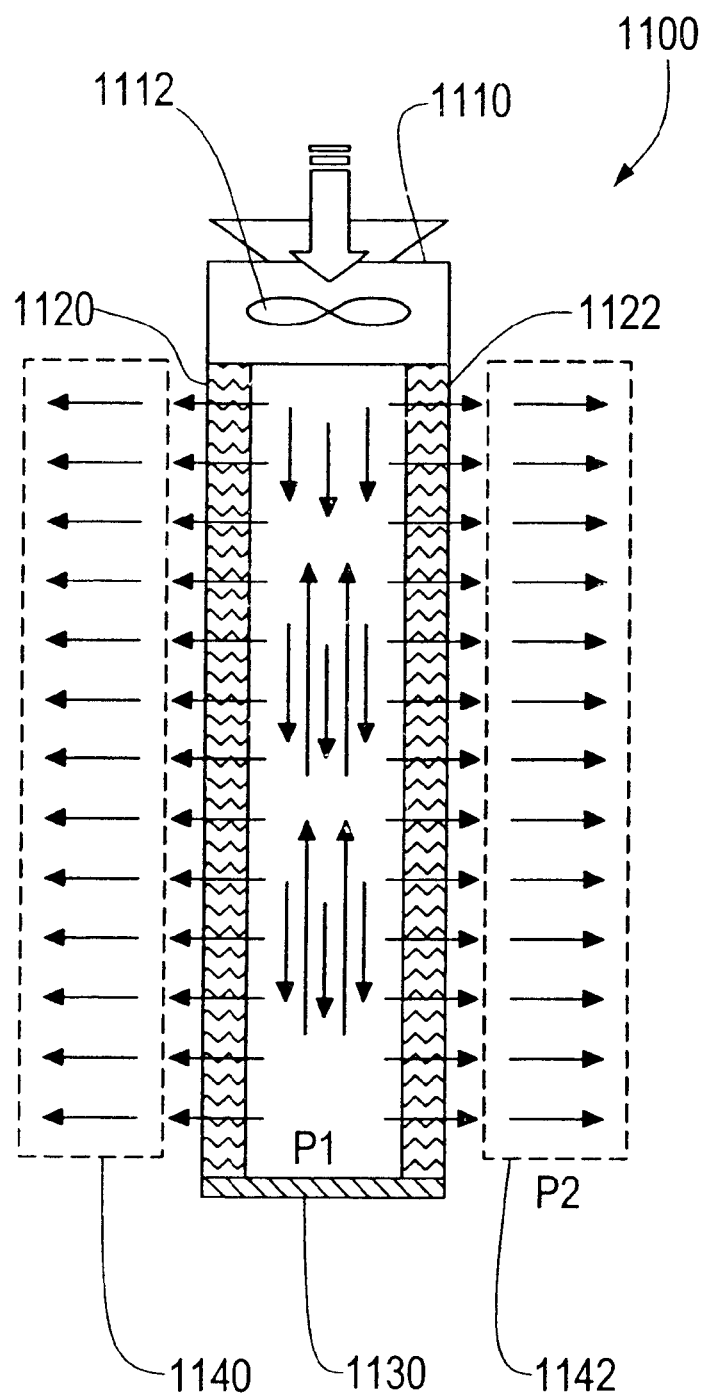
FIG. 11 illustrates a diffuser assembly according to an embodiment of the present invention.

FIG. 11 illustrates an embodiment of the present invention directed to an air diffuser assembly 1100 for generating a uniform flow of filtered air within a storage matrix. The diffuser assembly 1100 is centrally placed within the storage matrix and includes one or more tube shaped filter elements 1120 and 1122, an air source 1110 attached at the top of the diffuser assembly 1100, and an end cap 1130 attached at the bottom of the diffuser assembly 1100. The tube shaped filter elements 1120 and 1122 are preferably of a cylindrical shape. However, filter elements constructed on a plurality of planar sides (facets) are another example of the filter elements 1120 and 1122 that may be used.

The filter elements 1120 and 1122 are made of a material which sufficiently restricts airflow to require a high differential pressure (the pressure P2 in storage zones 1140 and 1142 being much less than the pressure P1 within the diffuser assembly 1100) for enabling airflow through the filter elements. More particularly, the material may be homogeneous to the degree that when exposed to a sufficiently high differential pressure (P1>>P2), the flow of air exiting the entire surface of the filter elements 1120 and 1122 achieves the desired uniformity. A fan or blower 1112 is mounted directly at the top of the diffuser assembly 1100 to provide the source of pressurized air. Alternatively, a fan or blower may be mounted remotely and connected using a duct system (not shown).

The back pressure created by the filter elements 1120 and 1122 counteracts the residual downward flow velocity and entrance velocity effects as the air enters the diffuser assembly 1100. Thereby, the construction of a diffuser assembly with a high aspect ratio (length/diameter) may be constructed without affecting the uniformity of flow exiting therefrom. Because the internal static pressure inside the diffuser assembly 1100 is equal throughout, the motive force for generating the exit flow will also be uniform, and a uniform airflow across the entire surface of the diffuser assembly 1100 results as shown by the arrows in FIG. 11. When the surrounding environment is either open, or is in a symmetrically vented chamber, the present diffuser assembly 1100 is sufficient to generate a uniform flow of air. In the case where cylindrically shaped filter elements 1120 and 1122 are installed with a vertical axis of symmetry, the airflow is horizontal, and exits radially at a uniform rate regardless of the elevation along the surface of the diffuser assembly 1100.

Figure 12A:
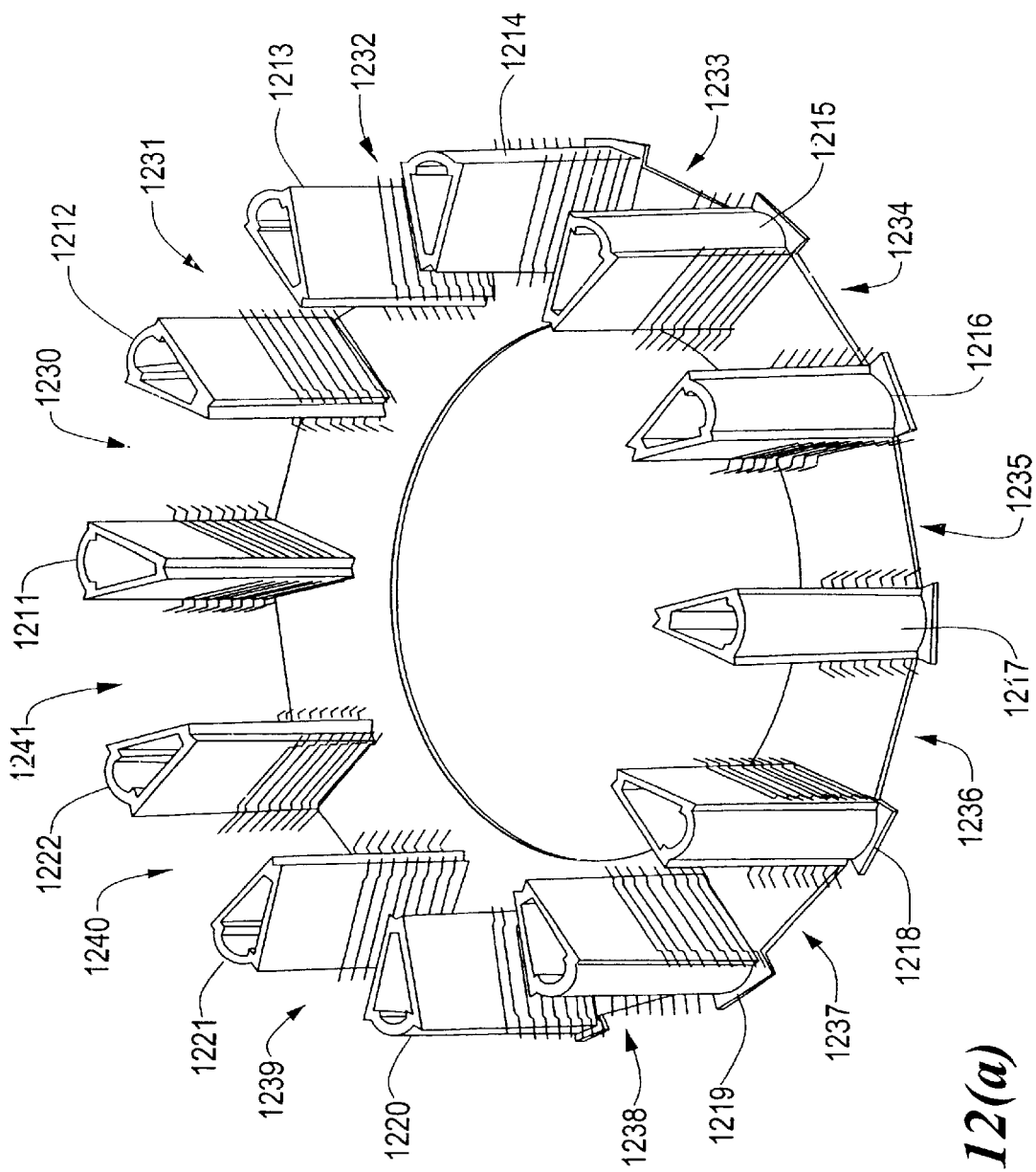
FIGS. 12(*a*) and 12(*b*) illustrate supports and channels for the diffuser assembly according to an embodiment of the present invention.
Figure 12B:
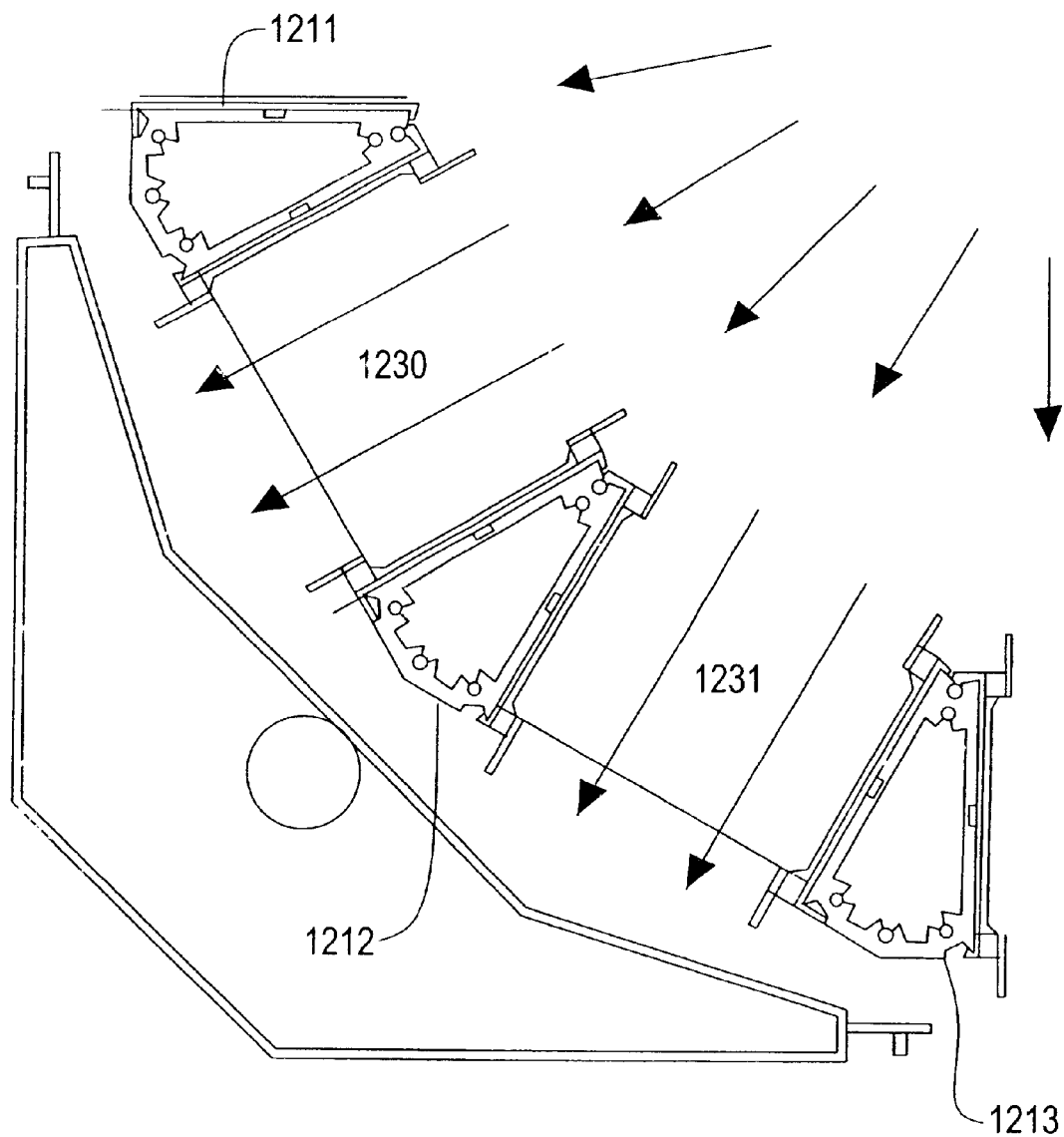
Figure 13:
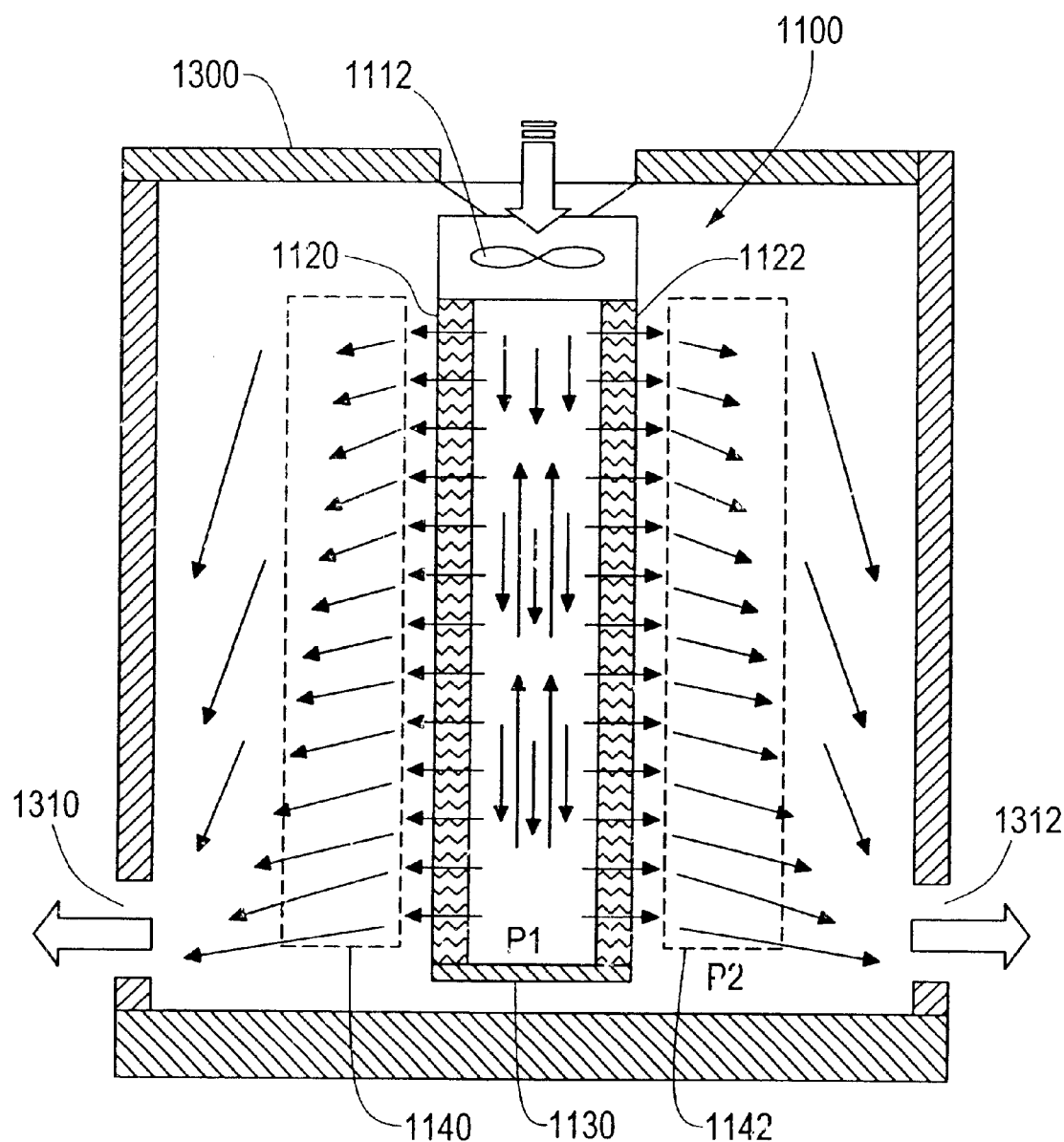
FIG. 13 illustrates a diffuser assembly in an enclosed chamber according to an embodiment of the present invention.

Once the air exits the diffuser assembly 1100, the uniformity of airflow is desired to be maintained. Initially, the air exiting the diffuser assembly 1100 travels radially outward, and as the air travel increases along the radius, the velocity decreases at a corresponding rate. To maintain an optimum airflow rate over the stored reticles, the storage matrix includes a plurality of storage columns 1211–1221 having wedged shaped cross sections as illustrated in FIGS. 12(a) and 12(b). The angle of the wedge shaped cross-sections of the storage columns 1211–1221 is such that the side channels 1230–1240, where the airflow passes and the stored reticles are supported, are parallel. Therefore, as the filtered air passes through the storage locations, no further reduction in the airflow rate occurs, and the stored reticles are exposed to a uniform airflow rate across their entire top and bottom surfaces irrespective of the radial distance from the surface of the filter elements 1120 and 1122.

For cases in which the diffuser assembly 1100 is in an enclosed chamber 1300, the method for removal of the air also affects the resulting uniformity of the airflow within the chamber 1300. As previously discussed, it is preferable to vent semiconductor equipment at or near the floor. Although the diffuser assembly 1100 generates uniform airflow, if one or more vents 1310 and 1312 are placed near the bottom of the chamber 1300, the airflow, once exiting the surface of the diffuser assembly 1100, tends to follow the path of least resistance. Accordingly, air exiting the bottom of the diffuser assembly 1100 has a shorter path to travel for exit from the chamber 1300 based on its proximity to the vents 1310 and 1312 and tends to continue traveling horizontally. However, air exiting towards the top of the diffuser assembly 1100 has a longer distance to travel and tends to develop a downward flow component shortly after exiting the diffuser assembly 1100 as shown by the arrows.

Figure 14:
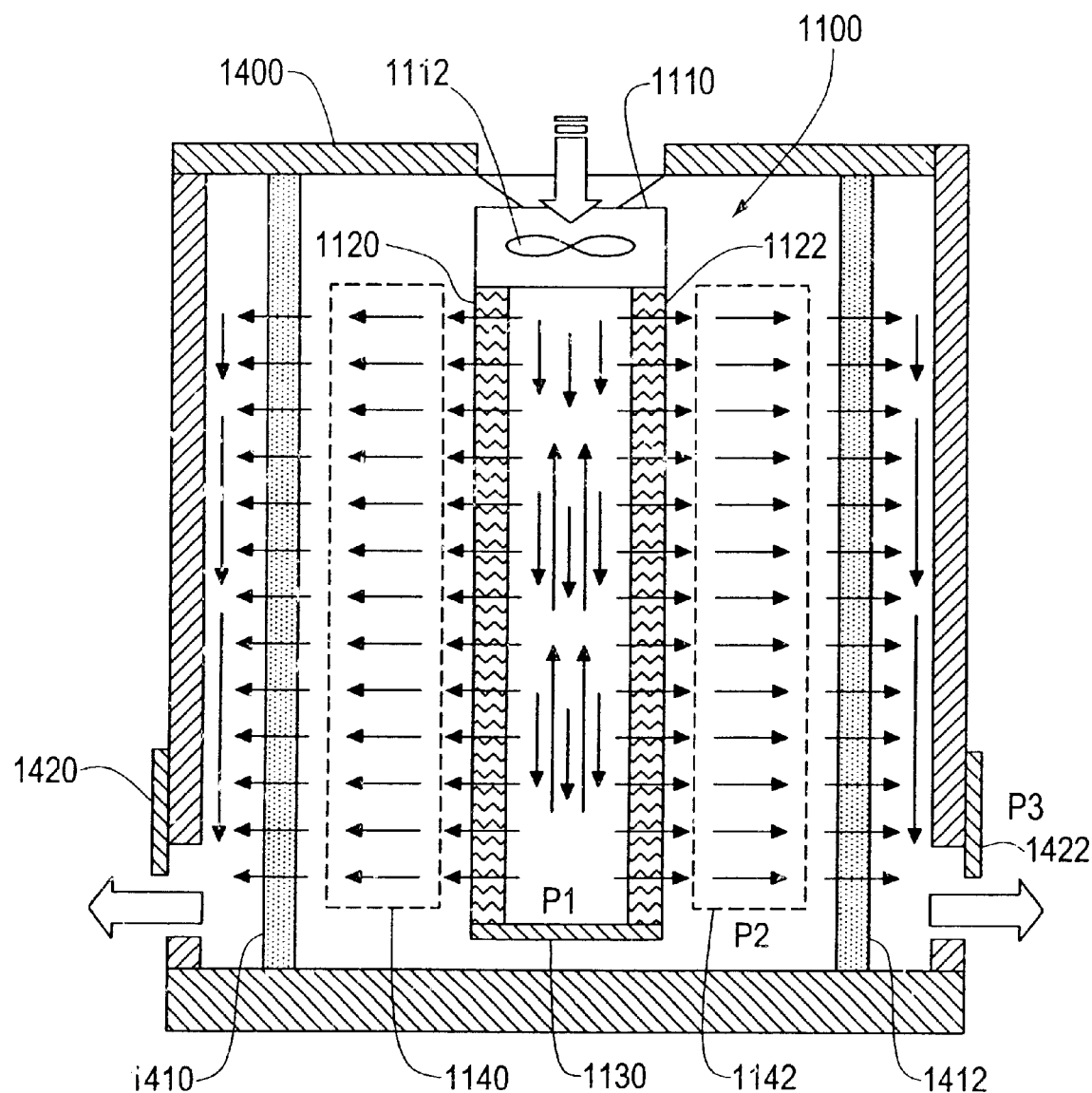
FIG. 14 illustrates a diffuser assembly in an enclosed chamber according to another embodiment of the present invention.

To counteract this tendency of the airflow to become disturbed by the asymmetric venting, a system of air returns is provided in an embodiment of the present invention as illustrated in FIG. 14. In this embodiment, air is collected in a uniform manner and conveyed to exhaust points while maintaining the uniformity of airflow within the chamber 1400 prior to entering air returns 1410 and 1412. The air returns 1410 and 1412 are hollow chambers (ducts) located around the central diffuser assembly 1100 and storage zones 1140 and 1142 to form an outer enclosure of the storage matrix.

The surface of the air returns facing the storage matrix are perforated, in one embodiment of the present invention, through the use of multiple perforated panels, to allow the air within the chamber 1400 to enter therethrough. The perforation schedule for panels of the air returns 1410 and 1412, commonly expressed in percent open area, is non-uniform as a function of the elevation within the chamber 1400. A smaller perforation schedule is used near the bottom of the chamber 1400 to add a restriction to the airflow (resistance to the airflow) and is gradually increased to a larger perforation schedule near the top of the chamber 1400 to encourage airflow. As a result, the effects of both the travel distance, and frictional flow losses that result are counteracted in the air returns 1410 and 1412.

With the proper perforation schedule applied to the air returns 1410 and 1412 as a function of elevation within the chamber 1400, the direction and uniformity of airflow at the exit time from the surface of the diffuser assembly 1100 until entering the air returns 1410 and 1412 are maintained. While the air traveling within the air returns 1410 and 1412 is no longer uniform, the performance of the charter 1400 at maintaining a uniform rate of filtered air across the stored reticles is no longer affected since the airflow has already passed over the stored reticles. The particular perforation schedule required to counteract the effects of the asymmetric exhaust is dependent on the specific geometry of the chamber, aspect ratio, air return cross section, and the particular airflow rate desired and can be determined through the application of known flow analysis equations, computer modeling or experimentation.

Adjustable exhaust ports 1420 and 1422 may be used in combination with the air returns 1410 and 1412 to allow for additional control of the airflow rates within each of the air returns 1410 and 1412 so that a positive pressure with respect to the clean room is maintained. The adjustable exhaust ports 1420 and 1422 may also counteract any negative effects as a result of the environment immediately surrounding the storage and retrieval system such as adjacent equipment or walls that may effect the air exhaust.

It will be apparent to those skilled in the art that other modifications to and variations of the above-described techniques are possible without departing from the inventive concepts disclosed herein. Accordingly, the invention should be viewed as limited solely by the scope and spirit of the appended claims.

What is claimed is:

1. A system for storing and retrieving items, comprising:
   an enclosed storage unit including,
      a movable storage matrix basing a plurality of bays for storing the items,
      a base unit for mounting said movable storage matrix thereon, and
      a drive mechanism connected to said base unit;
   an enclosed retrieval unit separate from said storage unit, said retrieval unit including,
      a transfer unit for retrieving the items from said movable storage matrix, said transfer unit passing the items between said storage unit and said retrieval unit through an access passage of said storage unit,
      a drive motor connected to said drive mechanism for moving said movable storage matrix,
      a track for positioning said transfer unit to retrieve the items;
   a controller for controlling said drive motor and said transfer unit for positioning said movable storage matrix to retrieve and store the items;
   a staging area for staging the items to be transferred between the transfer unit and an area external to the system, and
   an air circulator for uniformly supplying a vertical flow of externally supplied filtered air to said storage unit and then exhausting the filtered air from said storage unit after being circulated there through;
   a hollow diffuser assembly centrally located within said storage matrix for receiving said vertical flow of filtered air therein and for generating a uniform horizontal flow of the filtered air to said plurality of bays for storing the items; and
   wherein said diffuser assembly comprises a plurality of wedge shaped columns which create parallel storage slots for said bays to maintain and uniformly channel the filtered air therethrough.

2. A system according to claim 1, wherein said diffuser assembly comprises at least one filter element having a uniformly restrictive filter media and said uniformly restrictive filter media acting on said vertical flow of filtered air creates a pressurized air supply internal to said diffuser assembly for generating the uniform horizontal supply of the filtered air to said storage matrix.

3. The system of claim 1 wherein said air circulator includes a filter to supply filtered air to the core of said storage unit.

4. A system for storing and retrieving items, comprising:
an enclosed storage unit including,
a movable storage matrix having a plurality of bays for storing the items,
a base unit for mounting said movable storage matrix thereon, and
a drive mechanism connected to said base unit;
an enclosed retrieval unit separate from said storage unit, said retrieval unit including,
a transfer unit for retrieving the items from said movable storage matrix, said transfer unit passing the items between said storage unit and said retrieval unit through an access passage of said storage unit,
a drive motor connected to said drive mechanism for moving said movable storage matrix,
a track for positioning said transfer unit to retrieve the items;
a controller for controlling said drive motor and said transfer unit for positioning said movable storage matrix to retrieve and store the items;
a staging area for staging the items to be transferred between the transfer unit and an area external to the system, and
an air circulator for uniformly supplying a vertical flow of externally supplied filtered air to said storage unit and then exhausting the filtered air from said storage unit after being circulated therethrough;
a hollow diffuser assembly centrally located within said storage matrix for receiving said vertical flow of filtered air therein and for generating a uniform horizontal flow of the filtered air to said plurality of bays for storing the items; and
a plurality of air returns surrounding said storage matrix for counteracting asymmetric venting of the filtered air from said diffuser assembly.

5. A system according to claim 4, wherein said air returns are vertically oriented and comprise a variable air inlet geometry that increases the amount of vented air as the elevation within said storage matrix increases.

6. A system according to claim 4, wherein said enclosed storage unit comprises a plurality of adjustable exhaust ports for enabling said air returns to develop sufficient back pressure for the uniform flow of the filtered air.

7. A system for storing and retrieving reticles in a clean environment, comprising:
an enclosed storage unit including,
a cylindrical storage matrix having a plurality of bays for storing the reticles,
a rotatable base unit for mounting said cylindrical storage matrix thereon, and
a drive mechanism connected to said rotatable base unit;
an enclosed retrieval unit separate from said storage unit, said retrieval unit including,
a reticle transfer unit for retrieving the reticles from said cylindrical storage matrix, said reticle transfer unit passing the reticles between said storage unit and said retrieval unit through an access passage of said storage unit,
a drive motor connected to said drive mechanism for rotating said cylindrical storage matrix,
a track for positioning said reticle transfer unit to retrieve the reticles;
a controller for controlling said drive motor and said reticle transfer unit for positioning said cylindrical storage matrix to retrieve and store the reticles;
a staging area for staging the reticles to be transferred between the transfer unit and an area external to the system, and
an air circulator for uniformly supplying a vertical flow of externally supplied filtered air to said storage unit and then exhausting the filtered air from said storage unit after being circulated therethrough;
a hollow diffuser assembly centrally located within said storage matrix for receiving said vertical flow of filtered air therein and for generating a uniform horizontal flow of the filtered air to said plurality of bays for storing the reticles; and
wherein said diffuser assembly comprises a plurality of wedge shaped columns which create parallel storage slots for said bays to maintain and uniformly channel the filtered air therethrough.

8. The system of claim 7 wherein said air circulator includes a filter to supply filtered air to the core of said storage unit.

9. A system according to claim 7, wherein said diffuser assembly comprises at least one cylindrical filter element having a uniformly restrictive filter media and said uniformly restrictive filter acting on said vertical flow of filtered air creates a pressurized air supply internal to said diffuser assembly for generating the uniform horizontal supply of the filtered air to said storage matrix.

10. A system for storing and retrieving reticles in a clean environment comprising:
an enclosed storage unit including,
a cylindrical storage matrix having a plurality of bays for storing the reticles,
a rotatable base unit for mounting said cylindrical storage matrix thereon, and
a drive mechanism connected to said rotatable base unit;
an enclosed retrieval unit separate from said storage unit, said retrieval unit including,
a reticle transfer unit for retrieving the reticles from said cylindrical storage matrix, said reticle transfer unit passing the reticles between said storage unit and said retrieval unit through an access passage of said storage unit,
a drive motor connected to said drive mechanism for rotating said cylindrical storage matrix,
a track for positioning said reticle transfer unit to retrieve the reticles;
a controller for controlling said drive motor and said reticle transfer unit for positioning said cylindrical storage matrix to retrieve and store the reticles;
a staging area for staging the reticles to be transferred between the transfer unit and an area external to the system, and
an air circulator for uniformly supplying a vertical flow of externally supplied filtered air to said storage unit and then exhausting the filtered air from said storage unit after being circulated therethrough;
a hollow diffuser, assembly centrally located within said storage mans for receiving said vertical flow of filtered air therein and for generating a uniform horizontal flow of the filtered air to said plurality of bays for storing the reticles and
a plurality of air returns surrounding said storage matrix for counteracting asymmetric venting of the filtered air from said diffuser assembly.

11. A system according to claim 10, wherein said air returns are vertically oriented and comprise a variable air inlet geometry that increases the amount of vented air as the elevation within said storage matrix increases.

12. A system according to claim 10, wherein said enclosed storage unit comprises a plurality of adjustable exhaust ports for enabling said air returns to develop sufficient back pressure for the uniform flow of the filtered air.

13. A system for storing and retrieving items in a clean environment, comprising:
   an enclosed storage unit including:
      a movable storage matrix having a plurality of bays each for storing a respective item, the bays disposed about a central core; and
      a base unit for mounting said movable storage matrix thereon;
   a motor drive external to the storage unit and coupled to said base unit for moving the movable storage matrix;
   an enclosed retrieval unit separate from said storage unit and including a transfer unit for retrieving the items from said movable storage matrix, said transfer unit passing the items between said storage unit and said retrieval unit through an access passage of said storage unit;
   an air circulator for supplying a flow of air to the core of said storage matrix and the air circulator exhausting from the storage unit the air received from said plurality of bays; and
   a hollow diffuser assembly disposed in fixed location within the core of said storage matrix adjacent the plurality of bays for receiving said flow of air and providing a uniform horizontal flow of air across said plurality of bays.

14. The system of claim 13 including:
   a controller for controlling said motor drive and said transfer unit for positioning said movable storage matrix to retrieve and store the items in respective bays.

15. The system of claim 13 wherein said diffuser assembly includes a plurality of wedge shaped columns which create parallel storage slots for said bays to uniformly channel the air therethrough.

16. The system of claim 13 including a plurality of air returns surrounding said storage matrix for counteracting asymmetric venting of air from said diffuser assembly.

17. The system of claim 16 wherein said air returns are vertically oriented and have a variable air inlet configuration that increases the amount of vented air as the elevation within said storage matrix increases.

18. The system according to claim 16 wherein the storage unit includes a plurality of adjustable exhaust ports for enabling the air returns to develop sufficient back pressure for uniform flow of air.

19. A system for storing and retrieving reticles in a clean environment, comprising:
   an enclosed storage unit including:
      a rotatable cylindrical storage matrix having a plurality of bays each for storing a respective reticle, the bays disposed about a central core; and
      a base unit for mounting said rotatable cylindrical storage matrix thereon;
   a motor drive external to the storage unit and coupled to said base unit for rotating the rotatable storage matrix;
   an enclosed retrieval unit separate from said storage unit and having a transfer unit for retrieving the reticles from said cylindrical storage matrix, said transfer unit passing the reticles between said storage unit and said retrieval unit through an access passage of said storage unit;
   an air circulator for supplying a flow of air to the core of said storage matrix and for the air circulator exhausting from the storage unit the air received from the plurality of bays; and
   a hollow diffuser assembly disposed in fixed location within the core of said storage matrix adjacent the plurality of bays for receiving said flow of air and providing a uniform horizontal flow of air across said plurality of bays.

20. The system of claim 19 wherein said diffuser assembly includes a plurality of wedge shaped columns which create parallel storage slots for said bays to uniformly channel the air therethrough.

21. The system of claim 19 including a plurality of air returns surrounding said storage matrix for counteracting asymmetric venting of the air from said diffuser assembly.

22. The system of claim 21 wherein said air returns are vertically oriented and have a variable air inlet configuration that increases the amount off vented air as the elevation within said storage matrix increases.

23. The system according to claim 21 wherein the storage unit comprises a plurality of adjustable exhaust ports for enabling the air returns to develop sufficient back pressure for uniform flow of air.

24. The system of claim 19 wherein said air circulator includes a filter to supply filtered air to the core of said storage unit.

25. The system of claim 19 further including;
   a controller for controlling said drive motor and said transfer unit for positioning said movable storage matrix and said transfer unit to retrieve and store the reticles.

26. The system of claim 25 wherein the controller is affixed to a movable arm to permit adjustment of the operating position of the controller.

27. The system of claim 19 wherein the air circulator is disposed at the top of the storage unit.

28. The system of claim 19 wherein the storage unit includes:
   a plurality of frame supports each disposed at a corner of the storage unit;
   each of the frame supports including an air return passage extending substantially the entire length thereof, an air vent at the bottom portion of the frame support, and variable air return panels that allow the air to be removed from the core of the storage unit to the air return passage.

29. The system of claim 28 wherein the variable air return panels have an array of openings therethrough operative to permit varying amounts of air to escape from the core such that a uniform air flow is achieved across all of the plurality of bays of the storage unit.

30. The system of claim 19 a plurality of air return panels disposed in the storage unit on the exhaust side of the storage matrix and operative to permit uniform flow of air from said plurality of bays.

31. The system of claim 30 wherein the air return panels have variable openings therethrough to permit lesser flow of air at the bottom of the storage matrix and more air flow at the top of the storage matrix.

32. The system of claim 31 wherein the return panels have respective arrays of holes therethrough to provide increasingly greater air flow in relation to the height of the panel in the storage unit.

33. The system of claim 30 wherein the air panels regulate the flow rate of the air from the core to the air return passage ways to maintain substantially uniform air flow.

34. The system of claim 30 wherein the plurality of air return panels is vertically disposed along, the length of the frame supports.

35. The system of claim 30 wherein the plurality of air return panels provides an adjustable flow rate to establish and maintain a uniform horizontal air flow pattern across the bays.

36. The system of claim 33 wherein the retrieval unit includes corner frame supports for support of enclosing elements for the enclosed retrieval unit;

and wherein the movable reticle transfer unit moves vertically along the inner frame supports, and wherein the reticle transfer unit allows movement for placement and removable of reticles in response to commands from the controller.

37. The system of claim 19 wherein the reticle transfer unit includes a reticle garage for retaining a reticle after being removed from its bay.

38. The system of claim 19 wherein the diffuser assembly includes one or more filter elements having a high differential pressure for enabling air flow through the filter elements.

39. The system of claim 38 wherein the filter elements are tubular.

40. The system of claim 38 wherein the filter elements are planar.

41. The system of claim 38 wherein the one or more filter elements comprise a single tubular filter element.

42. The system of claim 38 including adjustable exhaust ports disposed outside the storage matrix to control the air flow rate.

43. The system of claim 19 wherein the base unit is configured from the storage matrix to minimize the entry of contaminants into the storage matrix.

44. The system of claim 19 wherein the motor drive is operative to align the storage matrix with the access passage of the storage unit to permit the transfer unit to pass a reticle between the storage unit and retrieval unit.

45. The system of claim 19 wherein the hollow diffuser assembly extends substantially along the length of the core.

46. The system of claim 19 wherein the air circulator includes an air supply for supplying the flow of air to the core of the storage matrix, an asymmetrical air return assembly disposed about the storage matrix on the exhaust side thereof and which is cooperative with the diffuser assembly to provide the uniform horizontal flow of air across the plurality of bays.

* * * * *

UNITED STATES PATENT AND TRADEMARK OFFICE
CERTIFICATE OF CORRECTION

PATENT NO.    : 6,562,094 B2
DATED         : May 13, 2003
INVENTOR(S)   : Jeffrey M. Denker et al.

It is certified that error appears in the above-identified patent and that said Letters Patent is hereby corrected as shown below:

Title page,
Item [75], Inventors, "Jonathan Gordan" should read -- Jonathan Gordon --;

Column 5,
Line 23, "1101" should read -- 110 --;

Column 6,
Line 61, "effect" should read -- affect --;

Column 9,
Line 66, "charter" should read -- chamber --;

Column 10,
Line 27, "basing" should read -- having --;
Line 51, "there through" should read -- therethrough --;

Column 12,
Line 61, "mans" should read -- matrix --;

Column 14,
Line 22, "off" should read -- of --; and
Line 56, "a" should read -- including a --.

Signed and Sealed this

Third Day of January, 2006

JON W. DUDAS
*Director of the United States Patent and Trademark Office*